United States Patent [19]

Egermeier

[11] Patent Number: 4,866,239

[45] Date of Patent: Sep. 12, 1989

[54] VAPOR SOURCE ASSEMBLY WITH CRUCIBLE

[75] Inventor: John C. Egermeier, Falls Church, Va.

[73] Assignee: The BOC Group, Inc., New Providence, N.J.

[21] Appl. No.: 200,332

[22] Filed: May 31, 1988

[51] Int. Cl.$^4$ .............................................. B23K 15/00
[52] U.S. Cl. .................................. 219/121.15; 373/11
[58] Field of Search ....................... 219/121.15, 121.16, 219/121.17, 121.18; 373/10, 11, 16, 17

[56] References Cited

U.S. PATENT DOCUMENTS

| | | | |
|---|---|---|---|
| 3,710,072 | 1/1973 | Shrader et al. | 219/121.15 |
| 3,883,679 | 5/1975 | Shrader et al. | 373/13 |
| 3,896,258 | 7/1975 | Hanks | 373/13 |
| 4,728,772 | 3/1988 | Smith | 219/121.16 |

Primary Examiner—C. L. Albritton
Attorney, Agent, or Firm—David A. Draegert; Larry R. Cassett

[57] ABSTRACT

A vapor source for the vacuum vaporization of a material which forms a positive meniscus with the wall of a crucible. The source comprises an electron-beam gun and a crucible for containing material to be vaporized. The crucible has a wall which makes an angle greater than about 35 degrees with the vertical; greater than 45° is preferred. A molten pool of material to be vaporized has a positive meniscus which contacts the wall at an angle greater than 90°. The positive meniscus enables a region of the wall just above the meniscus to be kept clear of condensed material. The source includes a means for adding molten material to the molten pool to maintain the meniscus in a desired range. If the pool level is sufficiently well controlled the meniscus can be maintained in the region free of condensed material and thus avoid the onset of a "thermal short".

12 Claims, 4 Drawing Sheets

VAPOR SOURCE ASSEMBLY WITH CRUCIBLE

BACKGROUND OF THE INVENTION

The invention relates to an electron-beam heated vapor source assembly for use in the field of vaporizing materials in high vacuum and, especially the field of deposition coatings on substrates.

Electron-beam heated vapor sources are frequently used in vacuum coating systems. One such vapor source is described in U.S. Pat. No. 3,710,072, issued to Robert L. Schrader and Kazumi N. Tsujimoto, and assigned to the assignee of the present application. This vapor source comprised a single crucible, a single electron-beam gun, and a magnetic means for deflecting the electron beam through an arcuate path from the electron-beam gun to the crucible. The magnetic deflecting means included two large, parallel plates of magnetic material which were positioned on opposite sides of the electron-beam gun and extended on opposite sides of the crucible. The plates were polarized by interconnecting them with a single permanent magnet near their ends which were further from the electron-beam gun. The electron beam was deflected by the magnetic field produced between the pole pieces. Three electromagnetic coils were arranged in a generally U-shaped structure to enable the beam to be swept across the crucible. The crucible of this prior vapor source was a copper block having a frustroconical wall for containing the material to be vaporized. The wall diverged upwardly at an angle of about 15° from the vertical. A second frustroconical section extends from the upper rim of the material containing wall and formed an upper cone for directing the vapor flow, and protecting other parts of the source from condensation of vapor. This upper section diverged at a larger angle, typically about 45°, and provided a hopper for melting loosely compacted material. The specification of U.S. Pat. No. 3,710,072 is incorporated herein by reference.

Electron-beam heated vapor sources having a plurality of crucibles for vaporizing different materials are also known. One such source is the model STIH-270-1 four-hearth source sold by the Edwards High Vacuum International Division of the assignee of the present application. This source has a hearth assembly containing four separate compartments for material to be vaporized and a means for rotating the assembly about an axis so that each compartment may be placed into the path of the electron beam.

When vaporizing some materials, such as aluminum and aluminum alloys in a copper or copper-alloy crucible, a problem sometimes occurs after material has been added to replenish the crucible. The ratio of vaporization rate to electron-beam power may decrease for successive replenishments. This is believed to occur because there may exist regions where the meniscus of the molten pool encounters previously condensed material on the wall of the crucible. This phenomenon is termed a "thermal short" since a portion of the beam power is diverted from vaporization into the crucible cooling water. In extreme cases, sufficient power may be diverted to a particular spot on the wall that the crucible wall disintegrates with resulting loss of molten material from the pool.

SUMMARY OF THE INVENTION

The present invention relates to a vapor source for the vacuum vaporization of a material which forms a positive meniscus with the wall of a crucible. The source comprises an electron-beam gun and a crucible for containing material to be vaporized. The vapor source has a magnet and a pair of parallel pole plates for deflecting the beam from the gun onto the crucible. The invention is particularly directed to a vapor source in which the beam is deflected through an angle in the range from about 240° to about 300° between the gun and the crucible. The crucible has a wall which makes an angle greater than about 35 degrees with the vertical; greater than 45° is preferred and 50° is more preferred. A molten pool of material to be vaporized has a positive meniscus which contacts the wall at an angle greater than 90°. The positive meniscus enables a region of the wall just above the meniscus to be kept clear of condensed material. The source includes a means for adding molten material to the molten pool to maintain the meniscus in a desired range. If the pool level is sufficiently well controlled the meniscus can be maintained in the region free of condensed material and thus avoid the onset of a "thermal short".

DESCRIPTION OF THE PREFERRED EMBODIMENTS

Figure 1:
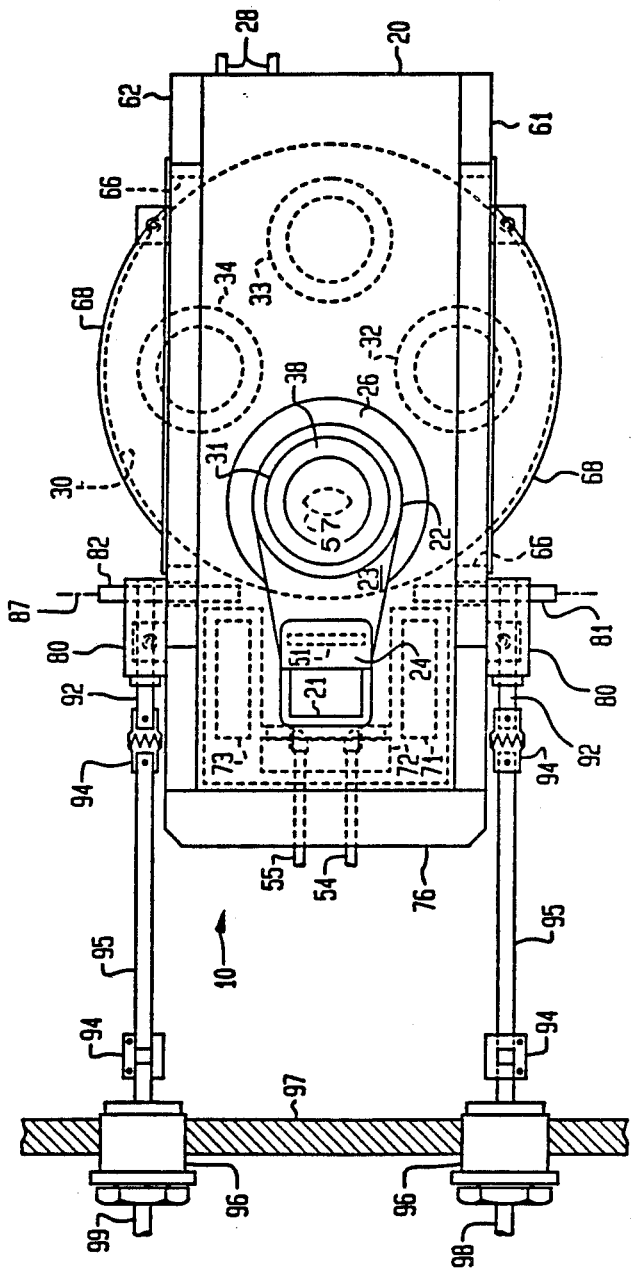
FIG. 1 is a plan view of a vapor source assembly according to the present invention.
Figure 2:
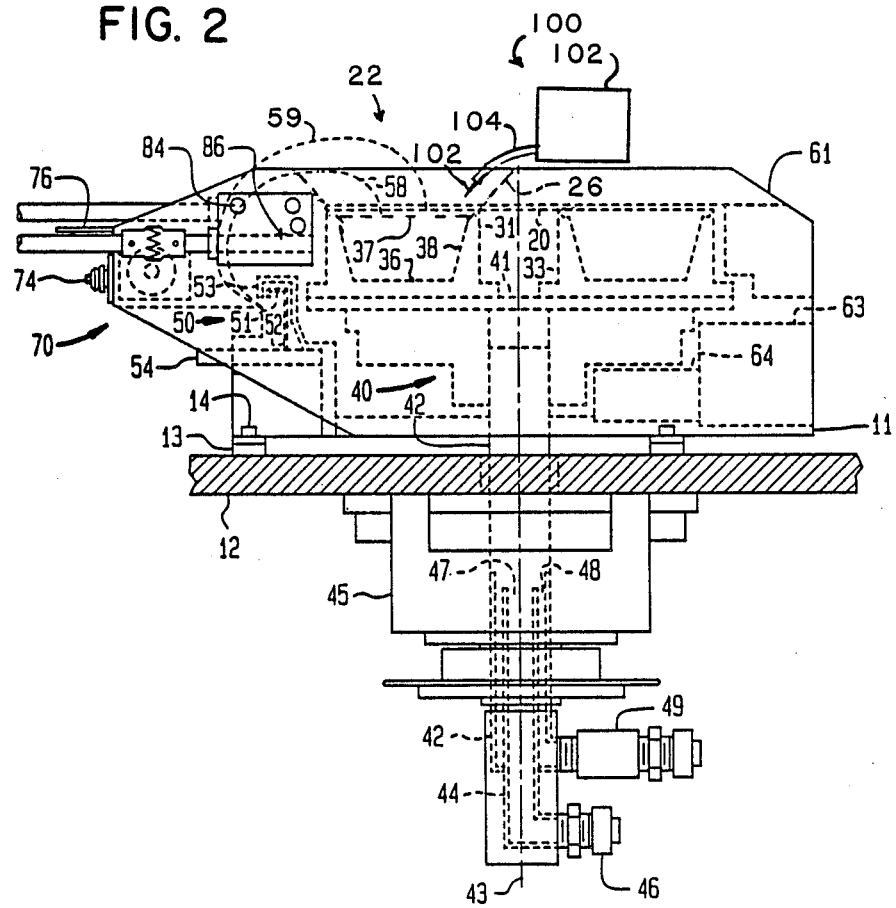
FIG. 2 is a side view of the vapor source assembly of FIG. 1.
Figure 3:
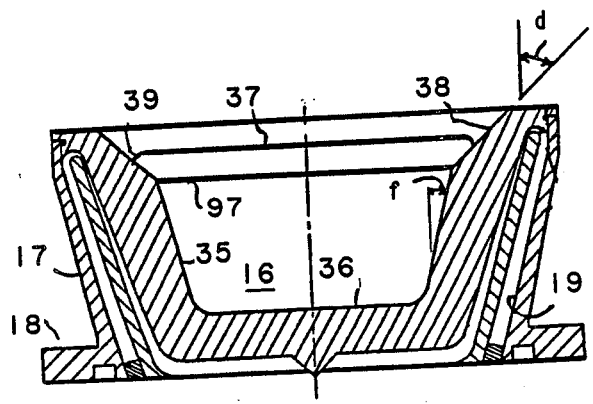
FIG. 3 is a side view, partially in cross-section, of a crucible according to the invention.

A preferred embodiment of the present invention is illustrated in FIGS. 1-3. This vapor source 10 comprises a crucible assembly 30, an electron-beam gun 50, and a magnetic means for deflecting the electron beam from the gun onto the hearth. The magnetic deflecting means comprises a primary deflecting means 60, an electromagnetic sweeping assembly 70, a pair of adjustable pole rod assemblies 80, and means for adjusting the extension of the pole rods. A material feeder 100 replenishes the supply of vaporizable material in the crucible.

The support structure for the vapor source 10 comprises a bottom plate 11, a top plate 20, and a pair of pole pieces 61, 62. Bottom plate 11 is a rectangular plate of non-magnetic material, preferably stainless steel, which extends between the two pole plates. The bottom plate is supported on a base plate 12 which may be the wall of the vacuum chamber. The bottom plate 11 and base plate 12 are separated by spacers 13 held in Place by bolts 14.

Top plate 20 is also a rectangular plate of a non-magnetic material, preferably copper, which extends between the top edges of the parallel pole plates 61, 62. The top plate has a generally rectangular opening 21 for enabling the electron beam to pass through the plate from the electron gun located below the top plate. The top plate has a circular opening 22 through which the beam passes back through the top plate onto the hearth located below the top plate. The openings 21 and 22 are separated by a bridge 23 which covers the electron beam gun and protects it from falling debris. To maximize the extent of the protective bridge, rectangular opening 21 has a slanted wall section 24 and circular opening 22 has a frustoconical wall section 26. Because the preferred embodiment is designed for operation with high electron beam powers, top plate 20 is provided with inlet and outlet water connectors 28 and a passage (not shown) interior to plate 20 for circulating cooling water.

The material to be vaporized by evaporation is placed in a crucible in the path of the electron beam. The preferred embodiment has four crucibles 31–34, each of which can be aligned with circular opening 22 in the top plate. The multiple crucibles may be formed from one block of material, but the preferred embodiment utilized four separate crucibles, each of which comprises a pocket element 16 and a support 17 which is a cylinder having a flange 18. The pocket element and the support enclose a channel 19 for cooling water. The composition and the dimension of each crucible are selected according to the quantity and physical and chemical properties of the materials to be vaporized. Copper is a preferred crucible material but molybdenum, graphite, and other materials may be used.

Preferably, the pocket of each crucible has a flat, circular bottom, a lower frustroconical wall section 35 which makes a small angle f with the vertical, and an upper section 38 which makes an angle d with the vertical. The molten pool of material in the crucible has a top surface 37. At the frustroconical wall 38, the molten pool forms a positive meniscus 39, the tangent of which makes an angle a, greater than 90° at the point where the meniscus contacts the wall 38, of the crucible.

Figure 4:
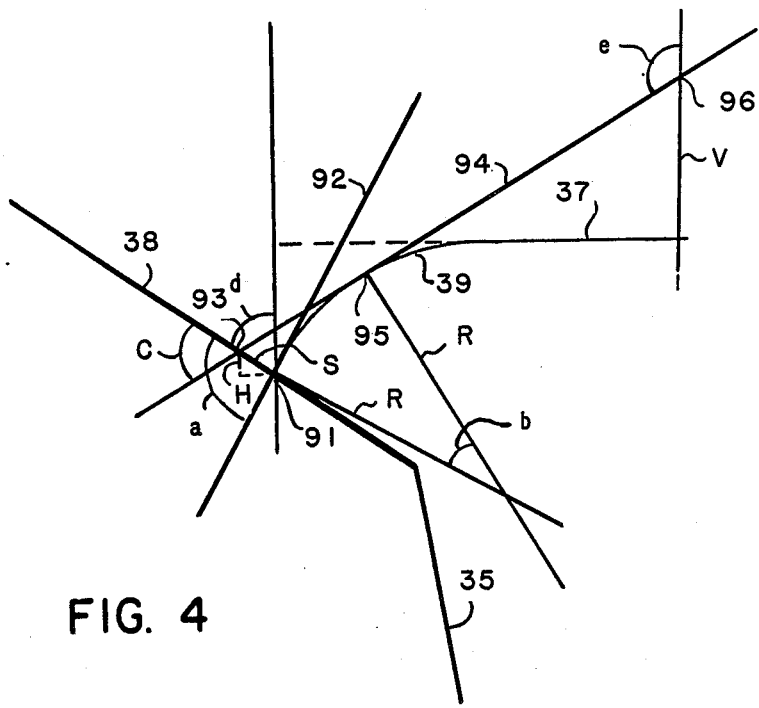
FIG. 4 is a detail view of the region where the meniscus contacts the crucible.

The details of the intersection of meniscus 39 and the wall 38 are shown in FIG. 4. To a first approximation, the meniscus can be represented as an arc of a circle of radius R between the horizontal level 37 of the molten pool and a point 91 at the wall 38 where the tangent 92 to the circle makes an angle a with the wall. It is well known that when an electron beam heated vapor source is operating at a high rate, the vapor seems to come from a "virtual source" located at a point 96 a distance V above the surface 37 of the molten pool. Thus, a region extending a distance S along the wall 38 is effectively shadowed by the positive meniscus 39. This distance S extends from the point 91, the intersection of tangent 92, to a point 93, the intersection of a line 94 that is tangent to the meniscus 39 at a point 95 and passes through the "virtual source" 96. Tangent 94 makes an angle e with the vertical. As shown in FIG. 4, the portion of arc approximating the meniscus extends through angle b from point 91 to point 95 and the tangent 94 makes an angle c with the wall 38. The projection of the distance S onto the vertical is H=S cos d. Simple trigonometry reveals that:

$$H = 2R \frac{\sin^2 (a - c)/2}{\sin c} \cos d$$

where c=e−d and b=a−c=a−e−d.

The four crucibles 31–34 are mounted on a carousel 40 which comprises a support plate 41 which is mounted on the end of a shaft 42 for rotation about an axis 43. Preferably, a ferrofluidic rotational feedthrough 45 is used to enable the crucible to be rotated by a drive means located outside the vacuum system. Preferably, the rotatable shaft 42 is hollow and surrounds a coaxial interior pipe 44 which enables water from an inlet connector 46 to pass through the interior of 47 the pipe to connect with internal passageways in support plate 41 and the crucibles 31–34 and return via a passage 48 external to the pipe to a water outlet connector 49.

The conventional electron-beam gun 50 is mounted on an extension of the bottom plate 11. The gun comprises a filament 51, a beam former 52, and an anode 53 which is normally grounded. Opposite ends of the filament 51 are connected to electric terminals 54 and 55 which can be connected to the negative terminals of a conventional electron-beam power supply.

The primary magnetic deflecting means 60 comprises a pair parallel plates 61, 62 of magnetic material. These plates make intimate contact with opposite ends of a permanent magnet 63 which is mounted on the bottom plate 11. If greater magnetic field strength is required, a second permanent magnet 64 may be installed. In order to increase the field strength in the region of the beam, the separation between the pole plates is reduced by providing an opening 66 in each pole plate through which crucible assembly 30 may protrude A pair of cover plates 68 are provided to protect the protruding crucibles from falling debris.

The path of the electron beam is indicated by dotted lines 58 and 59 in FIG. 2. From the electron beam gun, the beam is initially directed generally horizontally in a direction away from the crucible. The magnetic field first deflects the beam through an angle of approximately 90° so that the beam passes upward through top plate 20 via the rectangular opening 21, The beam is further deflected to become parallel to the top plate and then deflected downward through circular opening 22 onto an area 57 on the desired level 37 of material in the crucible aligned below this opening.

In some applications, it is desirable to use a broad, diffuse beam which has an impact area which is smaller but approximately the same size as the cross sectional area of the crucible. In the preferred embodiment, the strength of the magnetic field between the parallel plates 61, 62 is selected so that such a diffuse beam is obtained. In other applications, it is desirable to use a narrower beam having a smaller impact area when it enters the crucible. Such a narrower beam can be obtained by increasing the magnetic field in a region along the beam's path so as to focus the beam. To accomplish such focusing, the preferred embodiment includes two pole rod assemblies 80 having pole rods 81, 82. As described in U.S. Pat. No. 4,728,772 assigned to the assignee of the present invention, each rod passes through a clearance hole 85 in the one of the pole plates and extends into the region between the pole plates in the vicinity where the electron-beam passes.

In some vaporization applications, it is desirable to repetitively sweep the impact area of a narrow electron beam over the larger area of the crucible. The preferred embodiment includes a conventional beam sweeping assembly 70 comprising three electromagnetic coils 71–73 which are formed in a generally U-shaped assembly and connected to four electric terminals 74 which may be connected to a conventional X-Y beam sweeping circuits. A vapor shield 76 protects these terminals from falling debris.

The level of molten material in the crucible is maintained the desired range by adding vaporizable material to the molten pool. FIG. 2 shows a conventional positive-drive wire feeder 102 which contains a remotely controlled motor and drive wheels for unwinding a wire 103 from a spool and pushing it through a curved guide tube 104 into the molten pool. Other conventional means for replenishing the pool by feeding powder, pellets, ingots, or liquids may be used.

In operation, an initial charge of material is placed on the crucible and the chamber (not shown) enclosing the vapor source assembly is evacuated. The material is melted and vaporized by the electron-beam and is deposited as a coating on substrates positioned above the vapor source. If a load lock arrangement is used, the coated substrates can be removed and replaced with uncoated substrates while maintaining the vapor source in vacuum. Vaporizable material can be replenished while the substrates are replaced. Automatic control equipment may be used to monitor the deposition and direct the sequence of steps. When depositing an alloy coating, the depletion of the crucible during each deposition is held to less than about 10% of the crucible volume in order to avoid undersized variations in the composition of the deposited alloy.

In one situation, a crucible similar to FIG. 3 had a bottom diameter of 4.1 cm and a volume of approximately 67 cm$^3$. The pocket element was copper which was brazed to a support 17 of stainless steel 304. The crucible was charged with about 200 g of an aluminum alloy having 18% copper. The vapor source assembly was operated to evaporate about 20 g of material. This caused the height of the molten pool to drop by about 0.25 cm. Material was replenished by operating a wire feeder without breaking vacuum and the deposition-replenishment cycle repeated.

Figure 5:
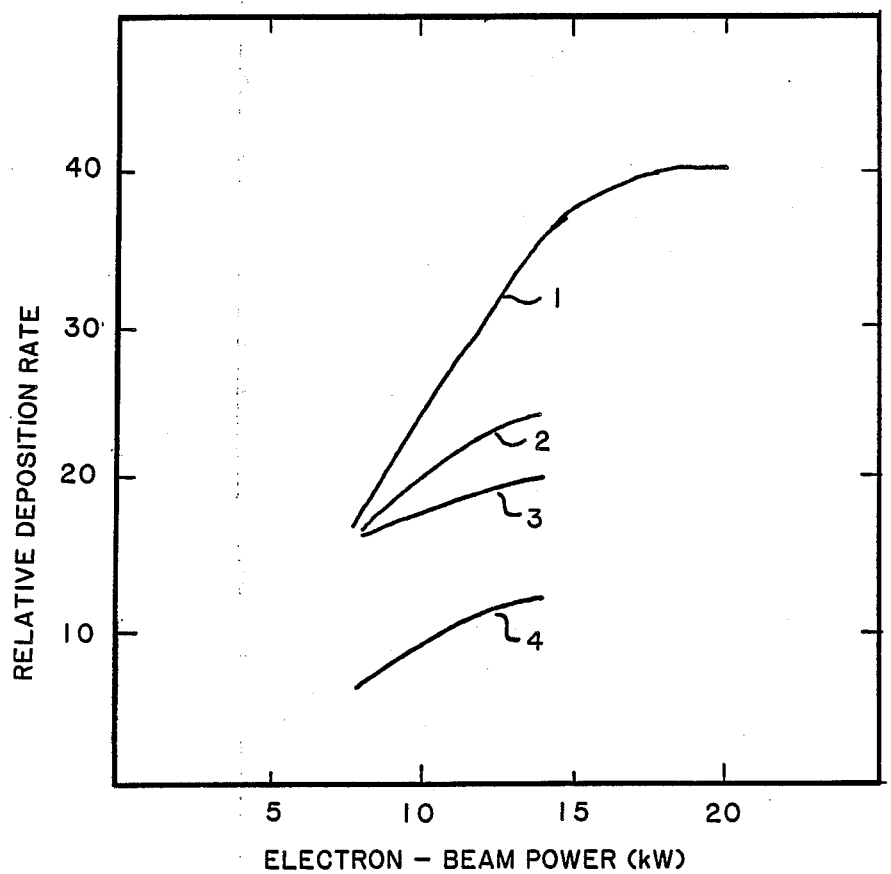
FIG. 5 is a comparative graph showing the deposition rate of a function of electron beam power for two vapor sources.

Results are shown by curve 1 of FIG. 5 which is a graph of the relative deposition rate as a function of electron-beam power. Curve 1 indicates the relative deposition rate after the thirtieth deposition cycle. The vapor source assembly provided substantially the same relative deposition rate for each of the preceding deposition cycles. The numerical values on the vertical axis correspond to the deposition rate (Angstroms per second) observed about 108 cm from the surface of the molten pool at a point 41 cm from the center line of the pool.

For comparison, FIG. 5 also shown data for similar deposition cycles of the same alloy contained in a crucible similar to FIG. 3 except that the wall made an angle of 15° with the vertical in the region where the molten pool contacted the crucible wall. Curves 2, 3, and 4 show the relative deposition rate after the first, fifth, and tenth deposition cycles, respectively, These data indicate a substantial decrease in the relative deposition rate as the number of deposition cycles increases. This demonstrates the superiority of the results obtained with the vapor source accordingly to the invention.

The various geometric material and electron-beam parameters of an deposition process are inter-related. The deposition parameters which can be obtained in a particular situation are most easily obtained by experiment and iteration. Approximate values of a, R, e, and V can be obtained by observation. The permissable variation in pool height and the lateral dimensions of the crucible determines the volume of material which can be evaporated before the material is replenished. For reliable operation, the actual variation in pool height is preferably less than the maximum permissable variation.

Typical values for the parameters of FIG. 4 are a=110°, d=45°, e=115°, R=0.25 cm, V=1.2 cm, and S=0.3 cm. The limits of the operable ranges for these parameters are not known with precision. The following ranges are believed possible in some circumstances: a=10° to 150°; d=30° to 60°; e=150° to 90°; R=0.08 to 0.5 cm; V=0 to 4 cm; S=0.1 to 2 cm.

What is claimed is:

1. A method of vaporizing a material which forms a positive meniscus with the wall of a crucible, comprising:
    placing the material in the crucible;
    directing an electron-beam onto the material to form a molten pool of material having a positive meniscus contacting the wall such that vaporized material condenses on a region of the wall above the meniscus but is substantially prevented from condensing on a portion just above the meniscus;
    adding material to the molten pool to maintain the meniscus contact point below the region of that wall where vaporized material has condensed.

2. The method of claim 2, wherein the angle of contact between the wall and the meniscus makes an angle of greater then 35 degrees with the vertical.

3. The method of claim 2, wherein the angle of contact between the wall and the meniscus is greater than 45 degrees.

4. The method of claim 3, wherein the material is aluminum or an aluminum alloy.

5. The method of claim 4, wherein the crucible is copper or a copper alloy.

6. The method according to claim 1 wherein material is vaporized and added in steps alternating at intervals under automatic control.

7. A source of vapor of a material which forms a positive meniscus with a crucible wall comprising,
    an electron-beam gun,
    a crucible having a wall for containing molten material to be vaporized wherein the wall has a region which makes an angle of greater than 35 degrees with the vertical;
    means for directing the electron-beam onto material in the crucible; and
    means for adding material to the crucible such that in intended operation molten material is maintained in contact with a portion of the wall region kept clear of condensed material by shadowing of the positive meniscus.

8. The vapor source according to claim 7 wherein the material adding means is remotely controlled such that material may be added without breaking vacuum.

9. The vapor source according to claim 8, wherein the region makes an angle greater than 45 degrees with the vertical 10. The vapor source according to claim 9 wherein the wall has a lower region which makes an angle with the vertical in the range 0 to 20 degrees.

11. The vapor source according to claim 10 wherein the crucible is copper or a copper alloy.

12. The vapor source according to claim 11 wherein the molten material is aluminum or aluminum alloy.

* * * * *